(12) United States Patent
Chen

(10) Patent No.: US 7,187,611 B2
(45) Date of Patent: Mar. 6, 2007

(54) METHOD OF USING AN E-FUSE DEVICE

(75) Inventor: Bei-Hsiang Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 49 days.

(21) Appl. No.: 10/904,401

(22) Filed: Nov. 9, 2004

(65) Prior Publication Data

US 2006/0098511 A1 May 11, 2006

(51) Int. Cl.
*G11C 7/00* (2006.01)

(52) U.S. Cl. .............................. 365/225.7; 365/185.05; 365/185.19

(58) Field of Classification Search ............. 365/225.7, 365/185.05, 185.19
See application file for complete search history.

(56) References Cited

U.S. PATENT DOCUMENTS 5,519,654 A * 5/1996 Kato et al. ............. 365/185.23
6,178,126 B1 * 1/2001 Kirihata et al. ............. 365/200
6,208,549 B1 * 3/2001 Rao et al. ................ 365/225.7
6,570,806 B2 * 5/2003 Bertin et al. ............. 365/225.7

* cited by examiner

*Primary Examiner*—Tuan T. Nguyen
(74) *Attorney, Agent, or Firm*—Winston Hsu

(57) ABSTRACT

A method of using an e-fuse device is provided. The e-fuse device includes a poly-fuse having one end connected to a source/drain region of a MOS transistor and the other end biased to a voltage ($V_{FS}$). In operation, a gate of the MOS transistor receives a step waveform pulse signal. The step waveform pulse signal encompasses a pre-heat voltage ($V_p$) at a first level during time period ($T_1$-$T_p$) and a maximum input voltage ($V_{IH}$) at a second level during time period ($T_p$-$T_2$). The pre-heat voltage ($V_p$) is smaller than the maximum input voltage ($V_{IH}$). The step waveform pulse signal is confined to a minimum input voltage ($V_{IL}$) before $T_1$ and after $T_2$. Preferably, the time period ($T_1$-$T_p$) is longer than 5 μs.

24 Claims, 7 Drawing Sheets

METHOD OF USING AN E-FUSE DEVICE

BACKGROUND OF INVENTION

1. Field of the Invention

The present invention relates to a method of using an e-fuse device, and more particularly to a method of fusing an e-fuse device by employing a multi-level voltage pulse.

2. Description of the Prior Art

As the integration of a semiconductor increases, the corresponding yield of the device may decrease. Because of the increasing density of memory cells within a semiconductor memory, memory fabrication techniques become more difficult and complicated. Since it is impossible to eliminate the presence of particles or other factors that causes defects, which decreases the yield, during the fabrication of a semiconductor device, a so-called redundancy circuit is conventionally used to make up the desired yield of a semiconductor device.

A redundant memory cell array is provided in the so-called redundancy circuit besides the regular memory array used to store binary data, wherein the redundant memory array replaces the defective memory cells within the regular memory array. Each of the memory cells within the redundant memory cell array is individually connected to the corresponding wordline and bitline. If a number of the memory cells found to be defective within the regular memory array is somewhere in the order of thousands after the test, the memory cells within the redundant memory cell array replace those memory cells found to be defective to make the memory still an irreproachable one.

Generally, the regular memory cell array and the redundant memory cell array in a conventional memory are connected through semiconductor fuse devices, which can be broken by a laser beam or an electrical current. In the case that a defective memory cell is found and needs to be recovered, the corresponding semiconductor fuse device is broken by a laser beam or an electrical current; if there are no defective memory cells found, semiconductor fuse devices remain intact. The kind of fuse device that is broken by an electric current when a defective memory cell is found is also known as an "e-fuse" device, which typically includes a strip of poly fuse with one end serially connected to a source/drain of a MOS transistor, and the other end of the poly fuse connected to a positive voltage. The MOS transistor has the other source/drain that is connected to ground, and a gate that is biased to a gate voltage to allow an electric current to flow through the poly fuse and break the poly fuse in a very short time.

Referring to FIG. 1, a $V_g$-Time plot showing a pulse voltage waveform applied to a gate of a MOS transistor of an e-fuse device to be broken according to prior art method is demonstrated. As shown in FIG. 1, the pulse voltage waveform is a single-level square waveform that can be generated by conventional voltage pulse generator. The simple pulse voltage waveform in FIG. 1 has a maximum voltage value $V_{IH}$ during time period $T_2$-$T_1$, and a minimum voltage value $V_{IL}$ that is typically 0 volt. Ordinarily, the maximum voltage value $V_{IH}$ is about the threshold voltage of the MOS transistor of the e-fuse device to be broken. Originally, the poly fuse strip of the e-fuse device has a resistance of about 100 ohm. After going through the fusing process, the resistance of the poly fuse strip ramps up to at least one mega ohm.

However, the prior art method of breaking the aforesaid e-fuse device is very difficult to control, thus leading to a low repair yield. According to the prior art, the process window for the maximum voltage value $V_{IH}$ is too small (±5%). Once the real maximum input voltage of the pulse exceeds the limit value, the poly-fuse strip ruptures immediately. Accordingly, there is a need in this industry to provide an improved method of using the e-fuse device that is capable of overcoming the aforesaid problem, thereby increasing the process window, reliability, and thus improving repair yield.

SUMMARY OF INVENTION

It is the primary object of the present invention to provide a method of using an e-fuse device to solve the above-described problems.

It is another object of the present invention to provide an electrical method for fusing an e-fuse, thereby providing larger process window and reliability as well as repair yield.

In accordance with the claimed invention, a method of using an e-fuse device is provided. The e-fuse device includes a poly-fuse having one end connected to a source/drain (S/D) region of a MOS transistor and the other end biased to a voltage ($V_{FS}$). In operation, a gate of the MOS transistor receives a step waveform pulse signal. The step waveform pulse signal encompasses a pre-heat voltage ($V_p$) at the first level during time period ($T_1$-$T_p$) and a maximum input voltage ($V_{IH}$) at second level during time period ($T_p$-$T_2$). The pre-heat voltage ($V_p$) is smaller than the maximum input voltage ($V_{IH}$). The step waveform pulse signal is confined to a minimum input voltage ($V_{IL}$) before $T_1$ and after $T_2$. The time period ($T_1$-$T_p$) is longer than 5 μs.

According to one aspect of the present invention, the poly-fuse strip comprises a polysilicon layer and a suicide layer laminated on the polysilicon layer, and wherein the first intermediate voltage ($V_{p1}$) is used to pre-heat the polysilicon layer and thus lower its resistance.

According to another aspect of this invention, a method of using an e-fuse device is provided. The e-fuse device comprises a poly-fuse strip. The method comprises providing a multi-level current signal to the poly-fuse strip during a time period ($T_1$-$T_2$). The multi-level current signal encompasses a pre-heat first current ($I_p$) during a time period ($T_1$-$T_p$), and a second current ($I_{IH}$) that is larger than the pre-heat first current ($I_p$) during a time period ($T_p$-$T_2$), such that a resistance of the poly-fuse strip is changed.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
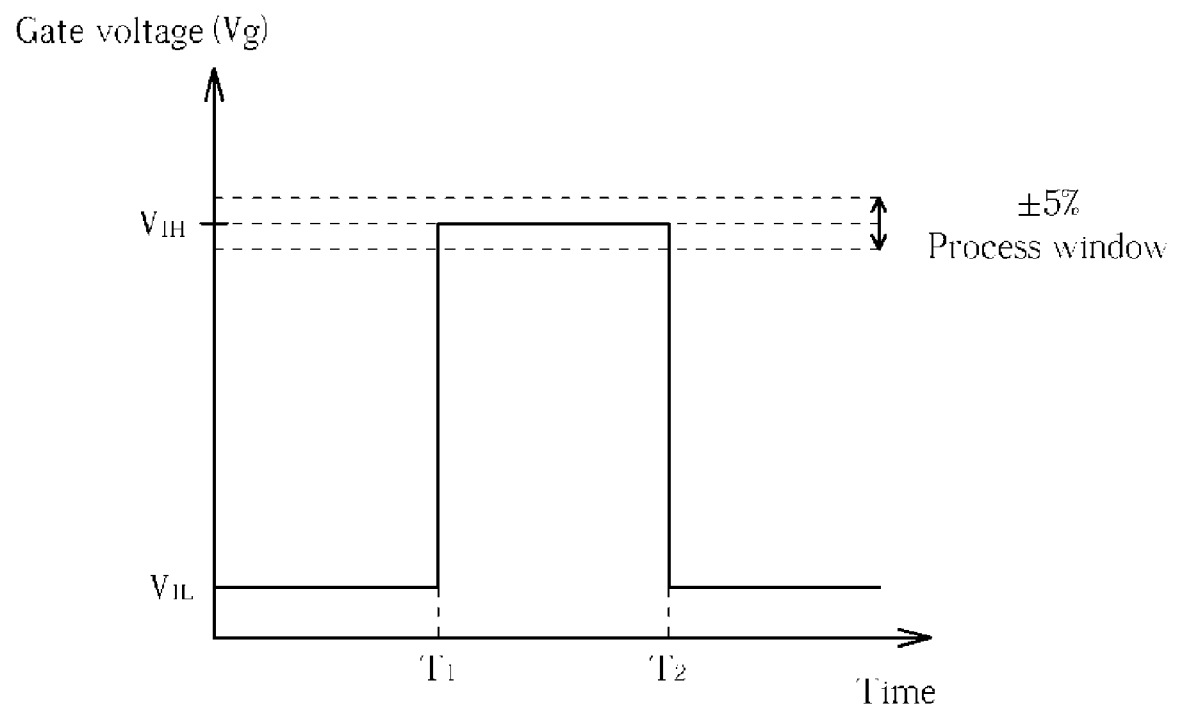
FIG. 1 is a $V_g$ vs. Time plot showing a pulse voltage waveform applied to a gate of a MOS transistor of an e-fuse device to be broken according to prior art method.
Figure 2:
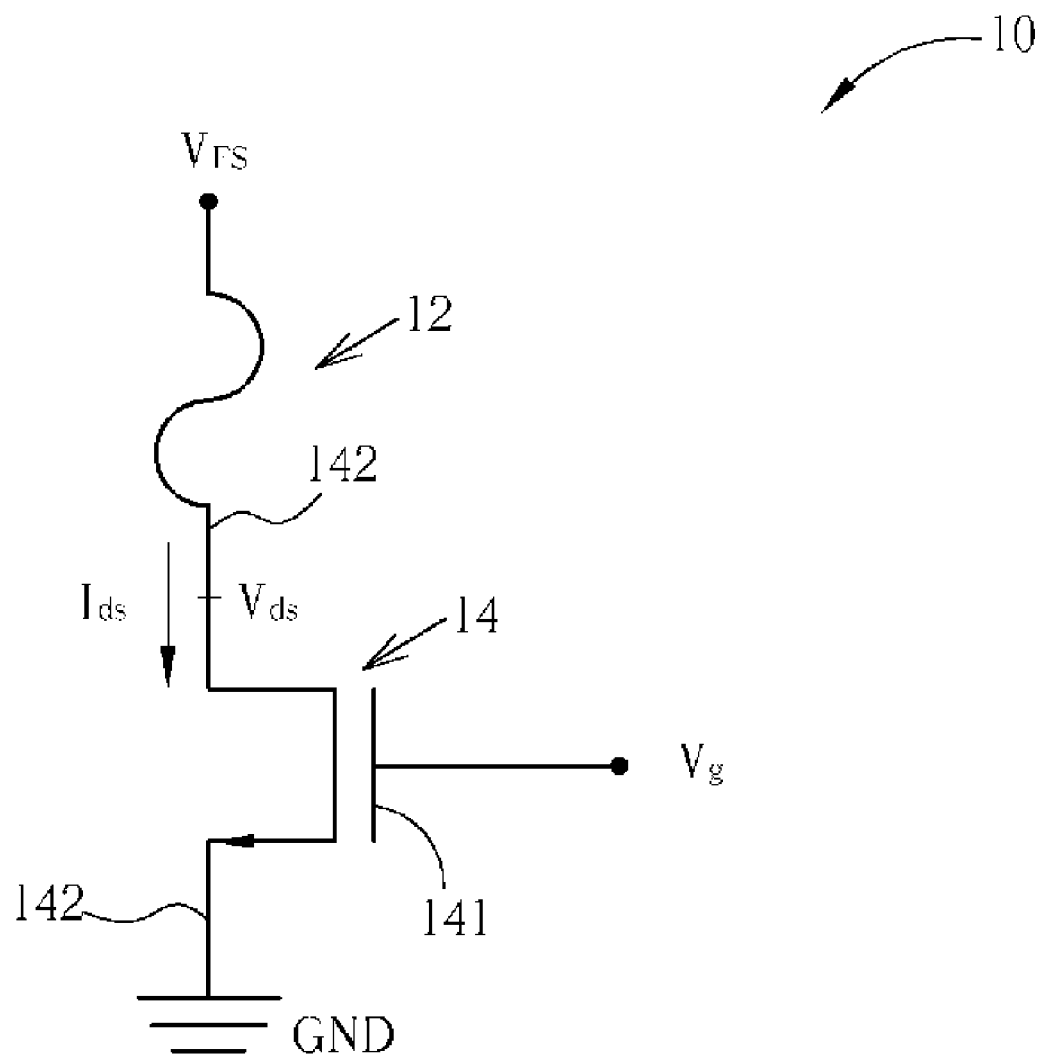
FIG. 2 is an equivalent circuit of an e-fuse device according to this invention.
Figure 3:
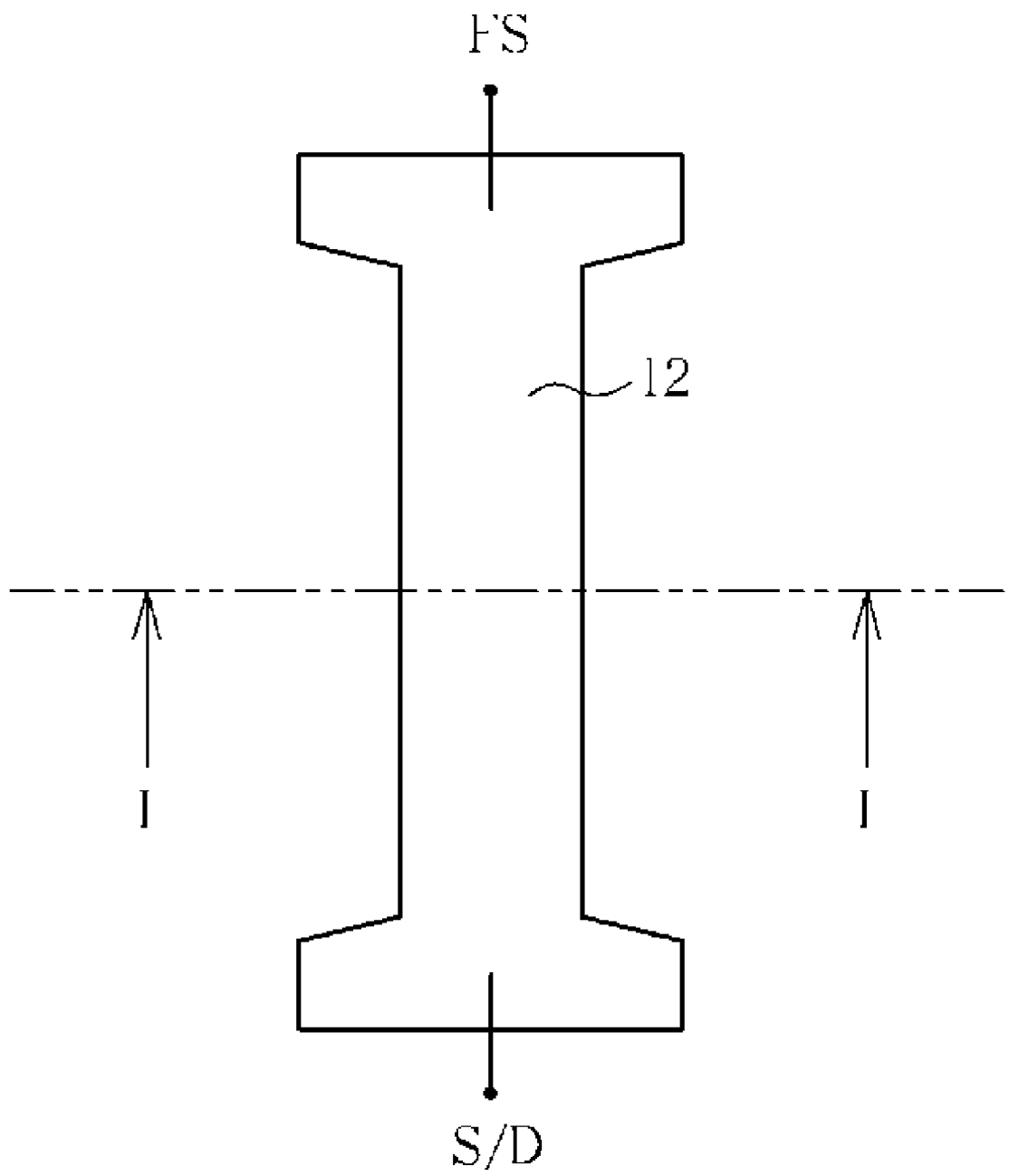
FIG. 3 is an exemplary enlarged plan view of a poly-fuse strip of an e-fuse device according to this invention.
Figure 4:
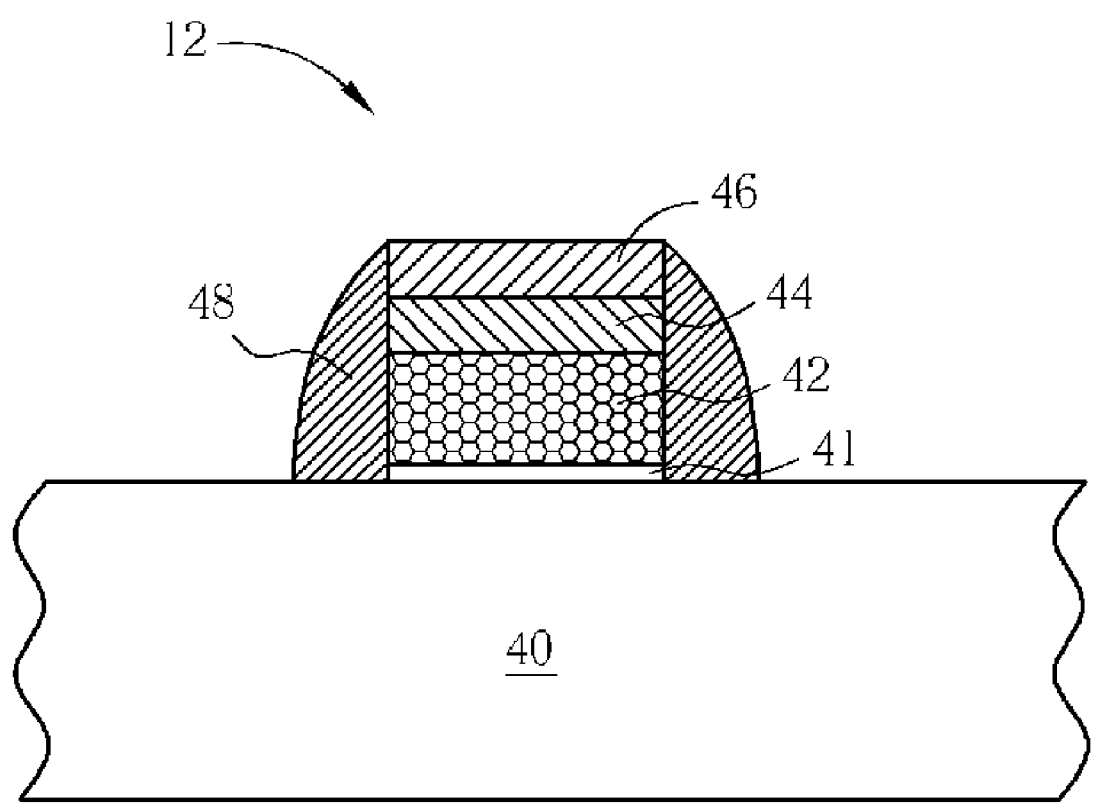
FIG. 4 is a schematic cross-sectional diagram showing the internal structure of the poly-fuse strip along line I—I of FIG. 3.

Please refer to FIG. 2 to FIG. 4, wherein FIG. 2 is an equivalent circuit of an e-fuse device 10 according to this invention; FIG. 3 is an exemplary enlarged plan view of a poly-fuse strip of an e-fuse device; and FIG. 4 is a schematic cross-sectional diagram showing the internal structure of the poly-fuse strip along line I—I of FIG. 3. As shown in FIG. 2, the e-fuse device 10 comprises a strip of poly-fuse 12 having one end serially connected to a source/drain (S/D) 142 of a MOS transistor 14. The MOS transistor 14 such as an NMOS transistor has a gate 141 formed on a channel region (not explicitly shown) and two space-apart S/D regions 142 situated next to the gate 141. The gate 141 of the MOS transistor 14 is connected to a gate voltage ($V_g$) source, which supplies a voltage pulse that turns the MOS transistor 14 on in a very short time (<1 second) to allow an electric current ($I_{ds}$) passing the poly-fuse 12, thereby turning the poly-fuse 12 into a high resistance state.

As shown in FIG. 3, and briefly back to FIG. 2, the other end of the strip of poly-fuse 12, which is hereinafter referred to as an FS (Fuse Source) terminal, is biased to a voltage $V_{FS}$. The voltage $V_{FS}$ may be a positive voltage. As mentioned, one S/D region 142 of the MOS transistor 14 is in series connection with the poly-fuse 12. The other S/D region 142 of the MOS transistor 14 is connected to ground. The gate 141 of the MOS transistor 14 comprises a polysilicon layer, a silicide layer and a cap nitride layer. The structure of the poly-fuse 12 is similar to that of the gate 141. As shown in FIG. 4, the poly-fuse 12, which is fabricated on a semiconductor substrate 40, comprises a polysilicon layer 42 laminated on an oxide layer 41, a silicide layer 44 laminated on the polysilicon layer 42, and a silicon nitride cap layer 46 capping the silicide layer 44. On its sidewalls, spacers 48 such as silicon nitride spacers are formed. In accordance with the preferred embodiment of the present invention, the silicide layer 44 is made of cobalt silicide, and the polysilicon layer 42 may be P type doped polysilicon layer, but not limited thereto. In other cases, the polysilicon layer 42 may be N type doped polysilicon layer, while the silicide layer 44 may be made of nickel silicide or the like.

Figure 5:
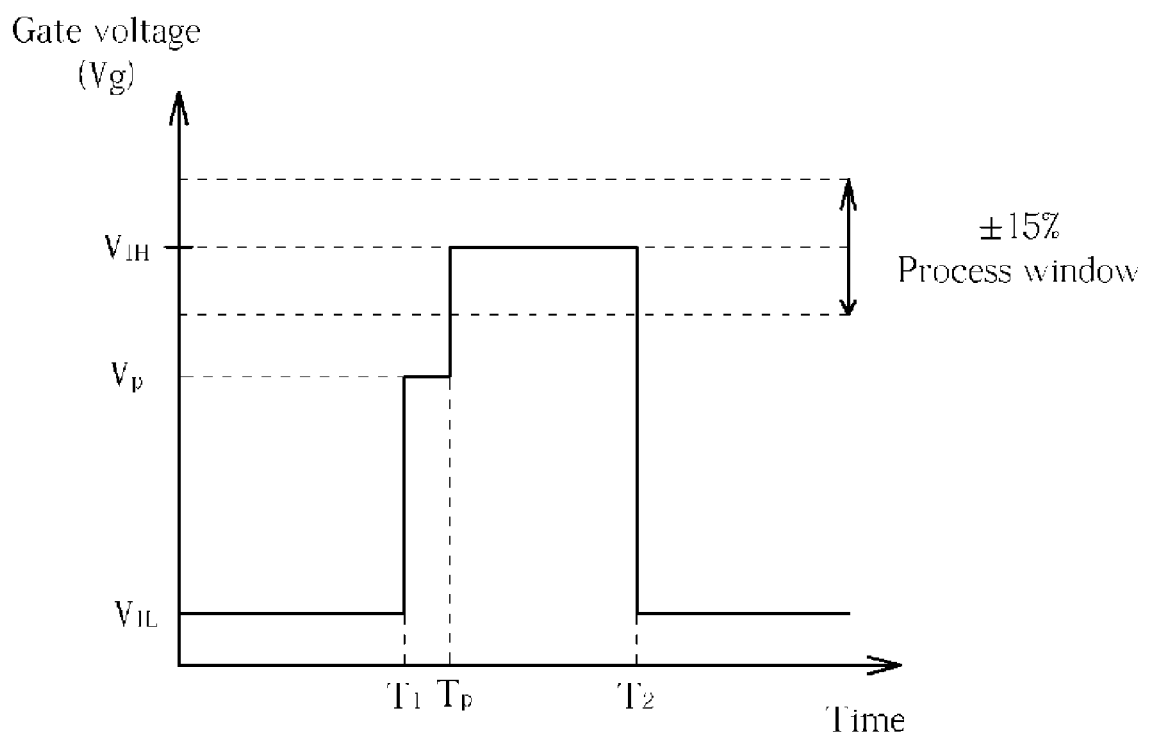
FIG. 5 demonstrates a $V_g$ vs. Time plot showing a step pulse voltage waveform applied to a gate of a MOS transistor during the fusing process of an e-fuse device to be broken according to the present invention method.

Please refer to FIG. 5. FIG. 5 demonstrates a $V_g$ vs. Time plot showing a schematic pulse voltage waveform applied to the gate 141 of the MOS transistor 14 during the fusing process of an e-fuse device 10 to be broken according to the present invention method. According to the preferred embodiment of the present invention, the pulse voltage signal for fusing the e-fuse device 10 is a step square waveform. The step pulse voltage signal encompasses a pre-heat voltage ($V_p$) at the first level during time period ($T_1$-$T_p$) and a maximum input voltage ($V_{IH}$) at second level during time period ($T_p$-$T_2$). The pre-heat voltage ($V_p$) is smaller than the maximum input voltage ($V_{IH}$). The maximum input voltage ($V_{IH}$) is about the threshold voltage ($V_{TH}$) of the MOS transistor 14. The step pulse voltage signal is confined to a minimum input voltage ($V_{IL}$) before $T_1$ and after $T_2$. Preferably, the minimum input voltage ($V_{IL}$) is about 0 volt. By applying the aforesaid step pulse voltage signal to the gate 141 of the MOS transistor 14, the resistance of the poly-fuse is dramatically increased from, for example, an initial value of about 100 ohm to about one mega ohm, but having no risk of rupturing the poly-fuse 12. Preferably, the pre-heat voltage ($V_p$) is approximately 70% to 90% of the maximum input voltage ($V_{IH}$).

By way of example, the maximum input voltage ($V_{IH}$) of the step pulse voltage signal is about 2.0V, the total time period ($T_2$-$T_1$) is about 200 μs. Preferably, the time period ($T_1$-$T_p$) is longer than 5 μs, for example, 5–10 μs, and the pre-heat voltage ($V_p$) is approximately 1.7V. It is noteworthy that the pre-heat voltage ($V_p$) is tuned to a sub-threshold voltage during the time period ($T_1$-$T_p$), which is approximately 70% to 90% of the maximum input voltage ($V_{IH}$), as mentioned. One unexpected benefit of replacing the prior art simple square waveform with the multi-level square waveform is the gain of the process window from ±5% to ±15%.

It is believed that a relatively small amount of electric current flows through the poly-fuse 12 at the first level during time period ($T_1$-$T_p$) directly ahead the major second level ($T_p$-$T_2$) contributes to the significant increase of the fusing process window. More specifically, the relatively small amount of electric current flows through the silicide layer 44 of the poly-fuse 12 and pre-heat the underlying polysilicon layer 42. As the temperature of the polysilicon layer 42 increases, the resistance of the polysilicon layer 42 of the poly-fuse 12 decreases. It is advantageous to do so because at the following major level ($T_p$-$T_2$) the pre-heated polysilicon layer 44 with reduced resistance may share the burden of the silicide layer 44 carrying high electric current at the maximum gate voltage $V_{IH}$. The pre-heat process also prevents the silicide layer 44 from the risk of direct evaporation or sublimation due to sudden electric current ramp.

Figure 6:
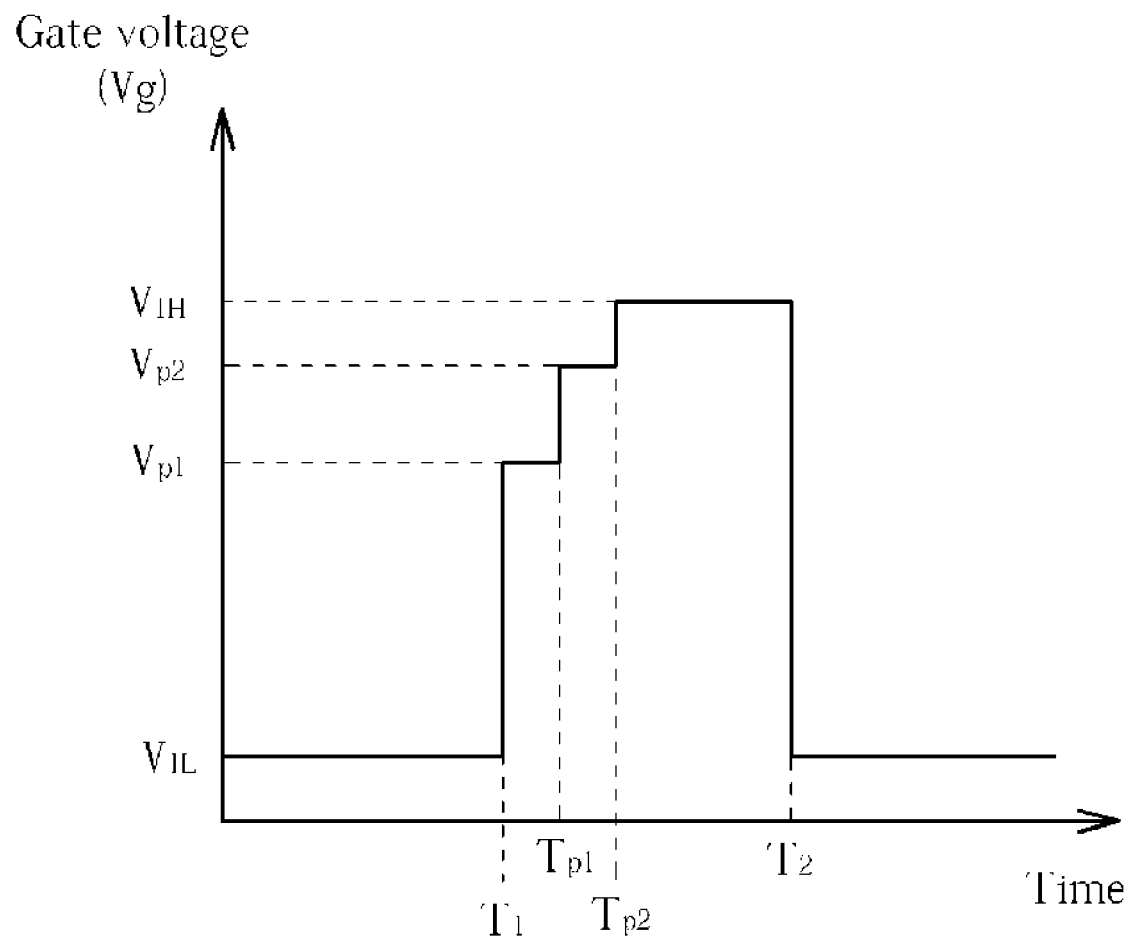
FIG. 6 demonstrates a $V_g$ vs. Time plot showing a step pulse voltage waveform applied to a gate of a MOS transistor during the fusing process of an e-fuse device to be broken according to the second preferred embodiment of the present invention method.

Please refer to FIG. 6. FIG. 6 demonstrates a $V_g$ vs. Time plot showing a step pulse voltage waveform applied to a gate of a MOS transistor during the fusing process of an e-fuse device to be broken according to the second preferred embodiment of the present invention method. As shown in FIG. 6, according to the second preferred embodiment of the present invention, the step pulse voltage waveform is a multi-level square waveform having a maximum gate voltage $V_{IH}$ during $T_{p2}$-$T_2$, a minimum gate voltage $V_{IL}$, and two intermediate gate voltages $V_{p1}$ and $V_{p2}$ during $T_1$-$T_{p2}$. The maximum gate voltage $V_{IH}$ is about the threshold voltage of the MOS transistor that is in series connection with the poly-fuse to be broken. The step pulse voltage signal is confined to the minimum input voltage ($V_{IL}$) before $T_1$ and after $T_2$. Preferably, the minimum input voltage ($V_{IL}$) is about 0 volt. By applying the aforesaid step pulse voltage signal to the gate 141 of the MOS transistor 14, the resistance of the poly-fuse is dramatically increased from, for example, an initial value of about 100 ohm to about one mega ohm, but having no risk of rupturing the poly-fuse 12. Preferably, the first intermediate gate voltage or pre-heat voltage ($V_{p1}$) is approximately 70% to 90% of the maximum input voltage ($V_{IH}$). The time period $T_1$-$T_{p1}$ is preferably longer than 5 μs. The second intermediate voltage ($V_{p1}$) is larger than the first intermediate voltage ($V_{p1}$) but is smaller than the maximum input voltage ($V_{IH}$).

Figure 7:
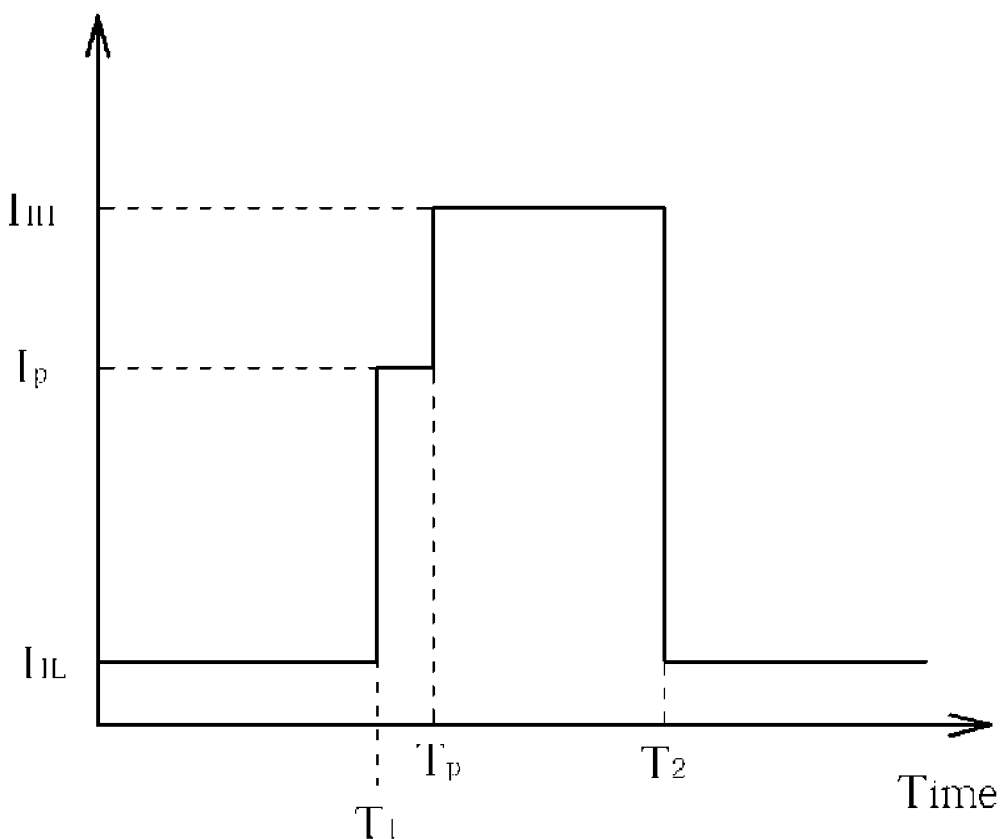
FIG. 7 is a schematic Current vs. Time (I-T) plot in accordance with the third preferred embodiment of this invention.

Referring to FIG. 7, a schematic Current vs. Time (I-T) plot is illustrated in accordance with the third preferred embodiment of this invention. As shown in FIG. 7, a two-step or two-level current is employed. Before Time $T_1$, the electric current passing the poly-fuse 12 of FIG. 2 is $I_{IL}$, which is close to zero. During time period ($T_1$-$T_p$), a pre-heat current $I_p$ is provided to the poly-fuse 12. During time period ($T_p$-$T_2$), a current $I_{IH}$ that is larger than pre-heat current $I_p$ is provided to the poly-fuse 12. By applying the aforesaid step current signal to the poly-fuse, the resistance of the poly-fuse is dramatically increased from, for example, an initial value of about 100 ohm to about one mega ohm or higher, but with no risk of rupturing the poly-fuse 12. The magnitude of the pre-heat current $I_p$ is preferably not larger than 24 mA. Preferably, the pre-heat current $I_p$ is about 20 mA or less than 20 mA. It is advantageous to do so because the relatively small current during time period ($T_1$-$T_p$) will amazingly increase the possibility of successful metal migration from the silicide layer 44 to the underlying polysilicon layer 42 of the poly-fuse 12, thereby forming a high-resistance poly-fuse without rupturing the fuse. Such metal migration occurs in an extreme short time period such as less than 1000 µs, even less than 400 ns (nanosecond).

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method of using an e-fuse device, the e-fuse device comprising a poly-fuse strip having one end connected to a source/drain region of a MOS transistor, and the other end biased to a voltage ($V_{FS}$), wherein, in use, a gate of the MOS transistor receives a step waveform pulse signal that encompasses a pre-heat voltage ($V_p$) at a first level during a time period ($T_1$-$T_p$) and a maximum input voltage ($V_{IH}$) at a second level during a time period ($T_p$-$T_2$), and wherein the pre-heat voltage ($V_p$) is smaller than the maximum input voltage ($V_{IH}$), and the step waveform pulse signal is confined to a minimum input voltage ($V_{IL}$) before time $T_1$ and after time $T_2$.

2. The method according to claim 1 wherein the step waveform pulse signal is a square waveform.

3. The method according to claim 1 wherein the poly-fuse strip is not ruptured after going through the time period ($T_1$-$T_2$), and has a resistance of at least one mega ohm.

4. The method according to claim 3 wherein the time period ($T_1$-$T_2$) is about 200 µs.

5. The method according to claim 1 wherein the time period ($T_1$-$T_p$) is longer than 5 µs.

6. The method according to claim 1 wherein the minimum input voltage ($V_{IL}$) is 0V.

7. The method according to claim 1 wherein the MOS transistor has the other source/drain region that is connected to ground.

8. The method according to claim 1 wherein the pre-heat voltage ($V_p$) is approximately 70% to 90% of the maximum input voltage ($V_{IH}$).

9. The method according to claim 1 wherein the poly-fuse strip comprises a polysilicon layer and a silicide layer laminated on the polysilicon layer, and wherein the pre-heat voltage ($V_p$) is used to pre-heat the polysilicon layer and thus lower its resistance.

10. The method according to claim 9 wherein the polysilicon layer is P type doped.

11. The method according to claim 9 wherein the silicide layer is made of cobalt silicide.

12. The method according to claim 1 wherein the voltage ($V_{FS}$) is a positive voltage.

13. A method of using an e-fuse device, the e-fuse device comprising a poly-fuse strip having one end connected to a source/drain region of a MOS transistor, and the other end biased to a voltage ($V_{FS}$), wherein, in use, a gate of the MOS transistor receives a multi-level square wave pulse signal that encompasses a first intermediate voltage ($V_{p1}$) at a first level during a time period ($T_1$-$T_{p1}$), a second intermediate voltage ($V_{p2}$) at a second level during a time period ($T_{p1}$-$T_{p2}$) and a maximum input voltage ($V_{IH}$) at a third level during a time period ($T_{p2}$-$T_2$), and wherein the first intermediate voltage ($V_{p1}$) is tuned to a sub-threshold voltage that is smaller than the maximum input voltage ($V_{IH}$), and the multi-level square wave pulse signal is confined to a minimum input voltage ($V_{IL}$) before time $T_1$ and after time $T_2$.

14. The method according to claim 13 wherein the time period ($T_1$-$T_{p1}$) is longer than 5 µs.

15. The method according to claim 13 wherein the MOS transistor has the other source/drain region that is connected to ground.

16. The method according to claim 13 wherein the minimum input voltage ($V_{IL}$) is 0V.

17. The method according to claim 13 wherein the first intermediate voltage ($V_{p1}$) is approximately 70% to 90% of the maximum input voltage ($V_{IH}$).

18. The method according to claim 13 wherein the second intermediate voltage ($V_{p2}$) is larger than the first intermediate voltage ($V_{p1}$) but is smaller than the maximum input voltage ($V_{IH}$).

19. The method according to claim 13 wherein the time period ($T_1$-$T_2$) is about 200 µs.

20. The method according to claim 13 wherein the poly-fuse strip comprises a polysilicon layer and a silicide layer laminated on the polysilicon layer, and wherein the first intermediate voltage ($V_{p1}$) is used to pre-heat the polysilicon layer and thus lower its resistance.

21. A method of using an e-fuse device, the e-fuse device comprising a poly-fuse strip, the method comprises providing a multi-level current signal to the poly-fuse strip during a time period ($T_1$-$T_2$), the multi-level current signal encompassing a pre-heat first current ($I_p$) during a time period ($T_1$-$T_p$), and a second current ($I_{IH}$) that is larger than the pre-heat first current ($I_p$) during a time period ($T_p$-$T_2$), such that a resistance of the poly-fuse strip is changed.

22. The method according to claim 21 wherein the time period ($T_1$-$T_p$) is less than 1000 µs.

23. The method according to claim 21 wherein the time period ($T_1$-$T_p$) ranges between 200 ns and 400 ns (nanoseconds).

24. The method according to claim 21 wherein the pre-heat first current ($I_p$) is less than 24 mA.

* * * * *